(12) United States Patent
Vickery, III

(10) Patent No.: US 7,890,912 B2
(45) Date of Patent: Feb. 15, 2011

(54) TREATMENT OF TRIM PHOTOMASK DATA FOR ALTERNATING PHASE SHIFT LITHOGRAPHY

(75) Inventor: Carl A. Vickery, III, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 432 days.

(21) Appl. No.: 11/937,166

(22) Filed: Nov. 8, 2007

(65) Prior Publication Data

US 2009/0125863 A1 May 14, 2009

(51) Int. Cl.
*G06F 17/50* (2006.01)

(52) U.S. Cl. .............................. 716/51; 716/50; 716/54; 716/55

(58) Field of Classification Search ...................... 716/4, 716/5, 19–21, 50, 51, 54, 55
See application file for complete search history.

(56) References Cited

U.S. PATENT DOCUMENTS

| 2003/0077526 A1* | 4/2003 | Randall et al. ................. 430/5 |
| 2008/0014684 A1* | 1/2008 | Blatchford et al. .......... 438/144 |
| 2008/0166889 A1* | 7/2008 | Rathsack et al. ............ 438/795 |

OTHER PUBLICATIONS

Fritze et al., "Subwavelength Optical Lithography with Phase-Shift Photomasks," Lincoln Laboratory, vol. 14, Nov. 2, 2003.*

* cited by examiner

*Primary Examiner*—Vuthe Siek
(74) *Attorney, Agent, or Firm*—Warren L. Franz; Wade J. Brady, III; Frederick J. Telecky, Jr.

(57) ABSTRACT

In accordance with the invention, there is a method of designing a lithography mask. The method can comprise generating initial phase photomask data and initial trim photomask data from a first set of data from a first drawn layer and/or layout and a second set of data from a second drawn layer, combining the initial phase photomask data with the first set of data to form a combined layer, inspecting for gaps in the combined layer, and processing the gaps in the combined layer.

16 Claims, 3 Drawing Sheets

TREATMENT OF TRIM PHOTOMASK DATA FOR ALTERNATING PHASE SHIFT LITHOGRAPHY

DESCRIPTION OF THE INVENTION

1. Field of the Invention

This invention relates generally to the field of integrated circuits and more specifically to a method and system for optimized treatment of photomask data for alternating phase shift lithography.

2. Background of the Invention

Conventional optical projection lithography has been the standard silicon patterning technology for the past 20 years. It is an economical process due to its inherently high throughput, thereby providing a desirable low cost per part or die produced. A considerable infrastructure (including steppers, photomasks, resists, metrology, etc) has been built up around this technology.

In this process, a mask, or "reticle", includes a semiconductor circuit layout pattern typically formed of opaque chrome, on a transparent glass (typically $SiO_2$) substrate. A stepper includes a light source and optics/lenses that project light coming through the reticle and images the circuit pattern, typically with a 4× to 5× reduction factor, on a photoresist film formed on a silicon wafer. The term "chrome" refers to an opaque masking material that is typically but not always comprised of chrome. The transmission of the opaque material may also vary such as in the case of an attenuating phase shift mask.

As the semiconductor industry continues to evolve, feature sizes of the pattern are driven to smaller resolution. To meet this demand, Resolution-Enhanced optical lithography Technologies ("RET") have become popular as techniques for providing patterns with sub-wavelength resolution. These methods include off-axis illumination ("OAI"), optical proximity correction ("OPC"), and phase-shift masks ("PSMs"). Such resolution-enhanced optical lithography methods are especially useful for generating physical devices on a wafer that require small size and tight design tolerance. Examples of such physical devices are the gate length of a transistor or the dimensions of contact cuts formed in inter-layer dielectrics.

One of the most common commercial implementations of phase shift mask technology is the double exposure method. In this method, the critical features are imaged using a phase shift photomask ("phase photomask") and the non-critical and trim features are imaged in a second exposure using a conventional chrome-on-glass mask, such as a trim photomask.

An example of a double exposure phase shift method is illustrated in FIGS. 1A-1C. In this method, fine features 12 are imaged on a substrate 14, shown in FIG. 1A, in the first exposure, using a phase shift photomask 20 shown in FIG. 1B. Definition of other features 112 and trimming of undesired phase edges are performed in a second exposure using a trim photomask 120 shown in FIG. 1C. The phase shift photomask 20 may contain additional opaque features 18.

A typical double exposure phase shift method uses a chrome-on-glass binary photomask for the trim photomask 120. In this case, chrome regions 122 on the trim photomask 120 prevent desired features produced by the phase shift photomask 20 from being exposed in the trim exposure.

Problems arise, however, when using the dual exposure method. For example, conventional techniques attempt to generate the phase and trim photomasks independently and then subsequently repair any design rule and/or lithography rule violations encountered in these two photomasks.

Accordingly, the present invention solves these and other problems of the prior art to provide a method that can process the phase photomask and trim photomask simultaneously in order to optimize the lithography on both masks.

SUMMARY OF THE INVENTION

In accordance with the invention, there is a method of designing a lithography mask. The method can comprise generating initial phase photomask data and initial trim photomask data from a first set of data from a first drawn layer and/or layout and a second set of data from a second drawn layer, combining the initial phase photomask data with the first set of data to form a combined layer, inspecting for gaps in the combined layer, and processing the gaps in the combined layer.

According to another embodiment of the invention, there is a method of designing a lithography mask. The method can comprise combining data describing a phase photomask with data describing a polysilicon layer to be formed on a substrate so as to form a combined set of data describing coverage of the phase photomask and the polysilicon and processing gaps in the combined set of data.

According to another embodiment of the invention, there is a computer readable medium comprising program code that configures a processor to perform a method of correcting a lithography mask. The computer readable medium can comprise program code for combining data describing a phase photomask with data describing a polysilicon layer to be formed on a substrate so as to form a combined set of data describing coverage of the phase photomask and the polysilicon and program code for processing gaps in the combined set of data.

Additional advantages of the embodiments will be set forth in part in the description which follows, and in part will be obvious from the description, or may be learned by practice of the invention. The advantages will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate embodiments of the invention and together with the description, serve to explain the principles of the invention.

DESCRIPTION OF THE EMBODIMENTS

Reference will now be made in detail to the present embodiments, examples of which are illustrated in the accompanying drawings. Wherever possible, the same reference numbers will be used throughout the drawings to refer to the same or like parts.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

Figure 1A:
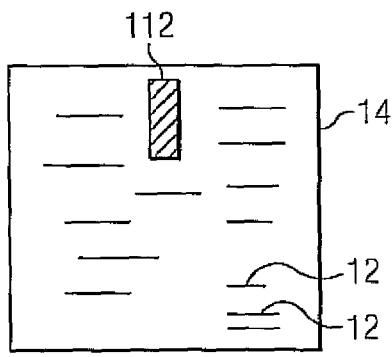
FIG. 1A is a diagram illustrating a substrate formed using a conventional double exposure method.
Figure 1B:
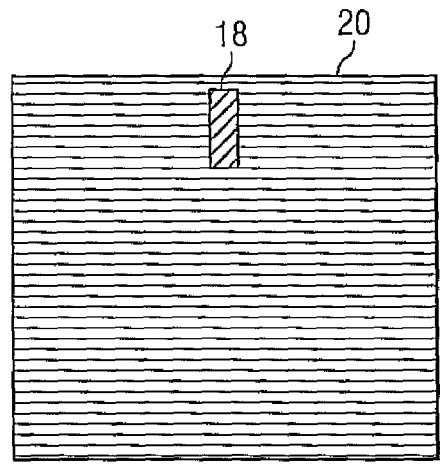
FIG. 1B. is a diagram illustrating a phase shift photomask in a conventional double exposure method.
Figure 1C:
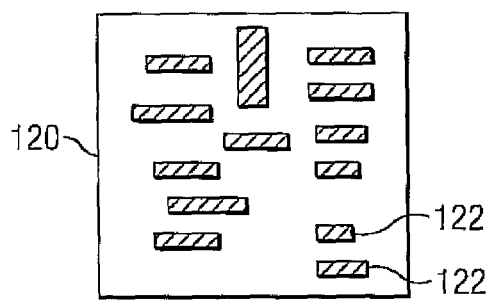
FIG. 1C is a diagram illustrating a trim photomask in a conventional double exposure method.
Figure 4:
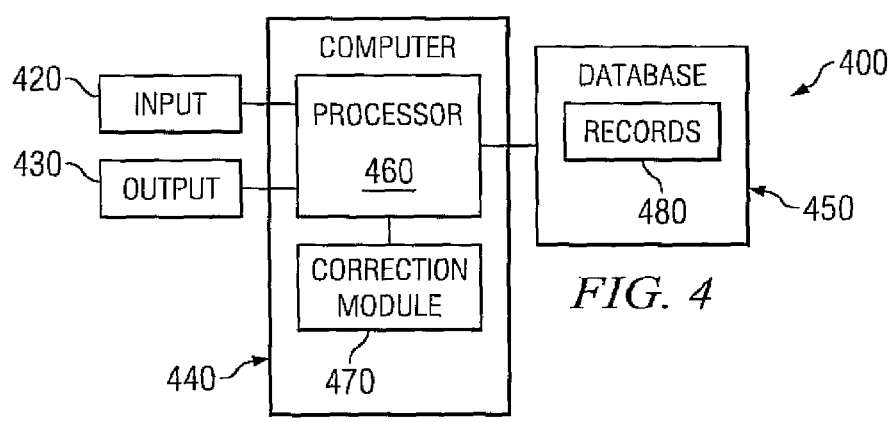
FIG. 4 illustrates a system for designing and correcting a photomask according to the present teachings.
Figure 2:
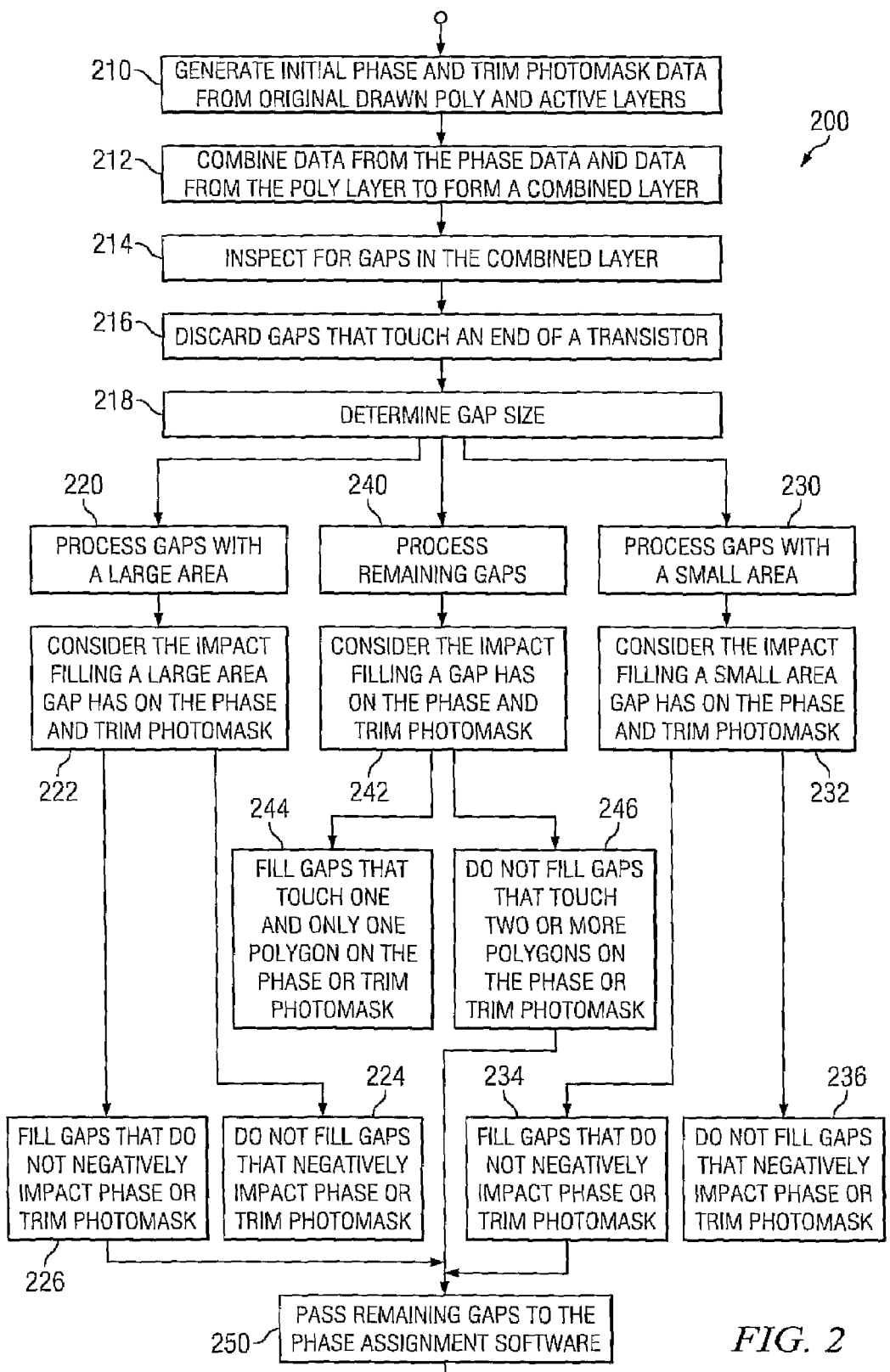
FIG. 2 is a flowchart illustrating one embodiment of a method for simultaneously forming a phase photomask and a trim photomask

Embodiments of the present invention and its advantages are best understood by referring to FIG. 2 through FIG. 4 of the drawings, like numerals being used for like and corresponding parts of the various drawings.

FIG. 2 is a flowchart 200 illustrating one embodiment of a method for correcting a mask pattern. For example, at 210 initial phase photomask data and initial trim photomask data used to generate a phase photomask and a trim photomask, respectively, is generated from a drawn layer, such as a poly layer and a drawn active layer.

Figure 3A:
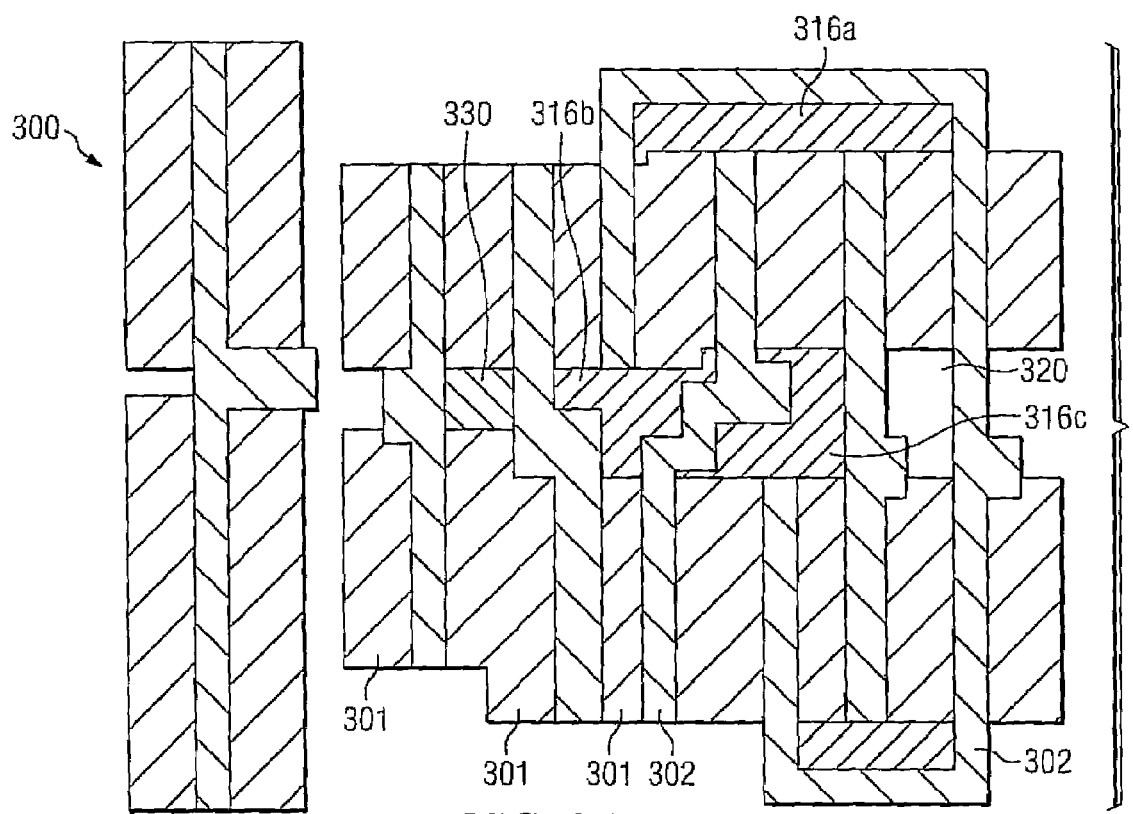
FIG. 3A illustrates a portion of a combined poly+phase layer including gaps according to the present teachings.
Figure 3B:
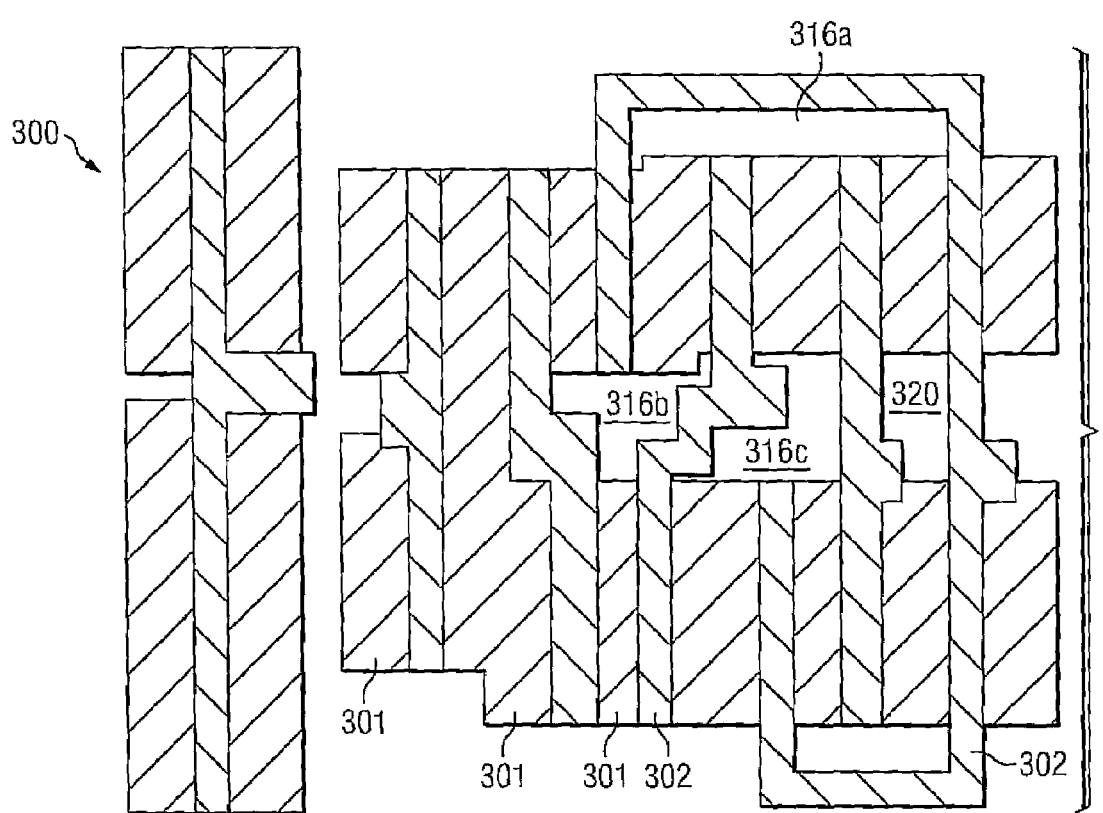
FIG. 3B illustrates the portion of a combined poly+phase layer of 3A after filling a gap according to the present teachings.

At 212 data from phase photomask can be combined with data from the drawn poly layer to form a combined phase+poly layer. For ease of understanding, FIGS. 3A-3B illustrate an example of a combined layout 300. It is to be understood that the disclosed example is exemplary and is in no way intended to limit the scope of the invention.

FIG. 3A depicts a combined poly+phase layer 300 that includes data from a phase photomask 301 and data from a drawn poly layer 302.

At 214 the combined layer/layout is inspected for gaps. Gaps that touch an end of a transistor can be identified at 216 and discarded. FIG. 3A depicts gaps 316a-c touching an end of a transistor. For example, gaps 316a-c that touch an end of a transistor can be a location defined by a gap between the final phase-0 and phase-π layers. Gaps that touch an end of a transistor should be retained to properly form the transistor. FIG. 3B depicts the result of retaining gaps 316a-c.

At 218 gaps identified in the combined layer/layout can be sorted based on relative size. For example, gaps can be sorted into very large gaps, very small gaps, and any remaining gaps, The size of a gap can be defined by the gap area and/or the aspect ratio. Further, the designation of whether a gap is considered very large or very small can be based on threshold values set by a user, such as a fabrication facility or chip designer.

At 220 gaps determined to have a very large size are processed. Processing can include determining the impact that filling very large gaps has on both the phase photomask and the trim photomask, shown at 222. For example, filling very large gaps may result in increasing the width of a phase aperture adjacent to a transistor. The increased phase aperture may pose a risk to the lithographic integrity of the transistor. In some cases, the increased phase aperture might form an overly narrow transistor that could be catastrophically eroded away. Alternatively, an excessively wide phase aperture may not cause a catastrophic failure but may fall outside of the range of phase apertures for which an optical proximity correction (OPC) recipe is properly anchored. In this case, the quality of the OPC results may be unpredictable. As such, any very large gaps that, if filled, would create an overly large phase aperture are not filled and are deleted at this step from the combined layer 300 and may be processed at a later time. This is shown at 224. These very large gaps can be dark (will have chrome) on the phase photomask and clear (will have no chrome) on the trim photomask. Gaps that do not negatively impact the phase photomask or trim photomask if filled are filled on the phase photomask and trim photomask at 226. For example, FIG. 3A depicts a large gap 320. FIG. 3B shows that large gap 320 is not filled.

At 230 gaps determined to have a very small size are processed. For example, FIG. 3A depicts a small gap 330.

Processing includes determining the impact that filling very small gaps has on both the phase photomask and the trim photomask, shown at 232. For example, very small clear features are difficult to print using the trim photomask only. Further, very small gaps may fall below the resolution capability of the lithography system. In such cases, gaps in the combined layer, shown at 214, can be used as a proxy for gaps in the underlying trim photomask. Gaps that are too small to print that are detected can be filled on both the phase photomask and the trim photomask, as shown at 234. These gaps will be clear (will have no chrome) on the phase photomask and will be dark (will have chrome) on the trim photomask. This can be accomplished by including an appropriate polygon on the phase photomask and on the trim photomask. FIG. 3B shows gap 330 as filled. As shown at 236, some small gaps may not be filled.

Gaps not determined to be excessively large or excessively small are processed at 240. As shown at 242, these gaps are of a size that may or may not be filled without impacting the quality of the lithography or exceeding a lithographic limit. Further, gaps touching one and only one polygon on the phase photomask can be identified. These gaps may be filled without impacting the subsequent phase assignment processing.

Moreover, these gaps can be filled on both the phase photomask and the trim photomask, show at 244. These gaps will be clear (will have no chrome) on the phase photomask and will be dark (will have chrome) on the trim photomask. Gaps touching a phase region on both sides of the same transistor can also be identified. Filling these gaps on the phase photomask will result in an insoluble phase assignment problem. As such, these gaps are deleted from the combined layer/layout 300, shown at 246.

Subsequently, at 250, any remaining gaps can be passed on to the phase assignment, or coloring software for further processing.

FIG. 4 illustrates a system 400 for designing and correcting a mask pattern, such as a pattern on a Phase photomask and/or a Trim photomask. System 400 includes an input device 420 and an output device 430 coupled to a computer 440, which is in turn coupled to a database 450. Input device 420 may comprise, for example, a keyboard, a mouse, or any other device suitable for transmitting data to computer 440. Output device 430 may comprise, for example, a display, a printer, or any other device suitable for outputting data received from computer 440.

Computer 440 may comprise a personal computer, workstation, network computer, wireless computer, or one or more microprocessors within these or other devices, or any other suitable processing device. Computer 440 may include a processor 460 and a correction module 470. Processor 460 controls the flow of data between input device 420, output device 430, database 450, and correction module 470. Correction module 470 may receive descriptions of a contour and an uncorrected pattern and can compute a corrected pattern that maybe used to define the contour.

Database 450 may comprise any suitable system for storing data. Database 450 may store records 480 that include data associated with the contour, uncorrected pattern, and corrected pattern. A record 480 may be associated with a segment of the pattern.

While the examples given have been with respect to patterning transistor gates over diffusion regions, the methods and systems described herein may also be used to correct patterns of other layers of integrated circuits. For example, the interconnect parts of a metal pattern may be divided into base and relational segments for improved critical dimension correction, leaving the corners and contact/via pads to be corrected as traditional placement-correction segments.

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function. Furthermore, to the extent that the terms "including", "includes", "having", "has", "with", or variants thereof are used in either the detailed description and the claims, such terms are intended to be inclusive in a manner similar to the term "comprising."

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A code driven method of designing a lithography mask using a processor, the method comprising:
   generating initial phase photomask data and initial trim photomask data respectively from a first set of data from a first drawn layer and a second set of data from a second drawn layer;
   using the processor, combining the initial phase photomask data with the initial trim photomask data to form a combined set of data describing a combined layer;
   using the processor, identifying gaps in the combined layer; and
   using the processor, processing the gaps in the combined layer, including:
      distinguishing between gaps greater than a predetermined size range, gaps smaller than the predetermined size range, and gaps within the predetermined size range; and
      processing gaps that are greater than the predetermined size range by filling gaps greater than the predetermined size range in cases where a resulting phase aperture is within a predetermined size range.

2. The method of designing a lithography mask according to claim 1, wherein processing the gaps in the combined layer further comprises:
   determining whether any of the gaps in the combined layer touch an end of a transistor pattern formed in the combined layer; and
   excluding those gaps in the combined layer that touch an end of a transistor from the processing.

3. The method of designing a lithography mask according to claim 1, wherein the predetermined size range includes at least one of an area and an aspect ratio.

4. The method of designing a lithography mask according to claim 1, wherein the gaps comprise holes, the holes comprising areas entirely surrounded in the combined layer.

5. The method of designing a lithography mask according to claim 1 wherein the gaps comprise hole-like areas partially surrounded in the combined layer.

6. A code driven method of designing a lithography mask using a processor, the method comprising:
   generating initial phase photomask data and initial trim photomask data respectively from a first set of data from a first drawn layer and a second set of data from a second drawn layer;
   using the processor, combining the initial phase photomask data with the initial trim photomask data to form combined set of data describing a combined layer;
   using the processor, identifying gaps in the combined layer; and
   using the processor, processing the gaps in the combined layer, including:
      distinguishing between gaps greater than a predetermined size range, gaps smaller than the predetermined size range, and gaps within the predetermined size range; and
      determining whether any of the gaps smaller than the predetermined size range are too small to print; and
      processing gaps that are too small to print by filling locations on a phase photomask and on a trim photomask that correspond to the gaps smaller than the predetermined size range.

7. A program code driven method of designing a lithography mask using a processor, the method comprising:
   using the processor, combining data describing a phase photomask with data describing a polysilicon layer to be formed on a substrate, so as to form a combined set of data describing coverage of the phase photomask and the polysilicon layer; and
   processing gaps in the combined set of data, including:
      distinguishing between gaps greater than a predetermined size range, gaps smaller than the predetermined size range, and gaps within the predetermined size range; and
      processing gaps greater than the predetermined size range by filling gaps greater than the predetermined size range in cases where a resulting phase aperture is within a predetermined size range.

8. The method of designing a lithography mask according to claim 7, wherein processing the gaps further comprises:
   determining whether any gaps in a combined layer represented by the combined set of data touch an end of a transistor pattern formed in the combined layer; and
   excluding those gaps in the combined layer that touch an end of a transistor from the processing.

9. The method of designing a lithography mask according to claim 7, wherein the predetermined size range includes at least one of an area and an aspect ratio.

10. The method of designing a lithography mask according to claim 7, wherein the gaps comprise holes, the holes comprising areas entirely surrounded in a combined layer represented by the combined set of data.

11. The method of designing a lithography mask according to claim 7 wherein the gaps comprise hole-like areas partially surrounded in a combined layer represented by the combined set of data.

12. A program code driven method of designing a lithography mask using a processor, the method comprising:

using the processor, combining data describing a phase photomask with data describing a polysilicon layer to be formed on a substrate, so as to form a combined set of data describing coverage of the phase photomask and the polysilicon layer; and processing gaps in the combined set of data, including:

distinguishing between gaps greater than a predetermined size range, gaps smaller than the predetermined size range, and gaps within the predetermined size range;

determining whether any of the gaps smaller than the predetermined range are too small to print; and processing gaps that are too small to print by filling locations on a phase photomask and on a trim photomask that correspond to the gaps smaller than the predetermined size range.

13. A non-transitory computer readable storage medium with an executable program code stored thereon, wherein the program code instructs a computer processor to perform a method of correcting a lithography mask comprising:

combining data describing a phase photomask with data describing a polysilicon layer to be formed on a substrate, so as to form a combined set of data describing coverage of the phase photomask and the polysilicon layer; and processing gaps in the combined set of data, including:

distinguishing between gaps greater than a predetermined size range, gaps smaller than the predetermined size range, and gaps within the predetermined size range; and processing gaps greater than the predetermined size range by filling the gaps greater than the predetermined size range in cases where a resulting phase aperture is within a predetermined size range.

14. The non-transitory computer readable storage medium according to claim 13, wherein the code instructed method further comprises:

determining whether any gaps in a combined layer represented by the combined set of data touch an end of a transistor pattern formed in the combined layer; and excluding those gaps in the combined layer that touch an end of a transistor from the processing.

15. The non-transitory computer readable storage medium according to claim 13, wherein the predetermined size range includes at least one of an area and an aspect ratio.

16. A non-transitory computer readable storage medium with an executable program code stored thereon, wherein the program code instructs a computer processor to perform a method of correcting a lithography mask comprising:

combining data describing a phase photomask with data describing a polysilicon layer to be formed on a substrate, so as to form a combined set of data describing coverage of the phase photomask and the polysilicon layer: and processing gaps in the combined set of data, including:

distinguishing between gaps greater than a predetermined size range, gaps smaller than the predetermined size range, and gaps within the predetermined size range;

determining whether any of the gaps smaller than the predetermined range are too small to print; and processing gaps that are too small to print by filling locations on a phase photomask and on a trim photomask that correspond to the gaps smaller than the predetermined size range.

\* \* \* \* \*